(12) United States Patent
Iwaguro et al.

(10) Patent No.: US 6,583,748 B1
(45) Date of Patent: Jun. 24, 2003

(54) ANALOG INPUT SELECTION CIRCUIT PROTECTED FROM NEGATIVE OVER-VOLTAGE

(75) Inventors: Kazuyuki Iwaguro, Tokyo (JP); Mitsuru Sugita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/208,822

(22) Filed: Aug. 1, 2002

(30) Foreign Application Priority Data

Jan. 30, 2002 (JP) .......................... 2002-022438

(51) Int. Cl.[7] .............................................. H03M 1/36
(52) U.S. Cl. ...................... 341/160; 341/155; 341/161; 341/163
(58) Field of Search ................... 341/160, 161, 341/163, 155

(56) References Cited

U.S. PATENT DOCUMENTS 6,177,900 B1 * 1/2001 Nakaigawa ................. 341/160
6,310,571 B1 * 10/2001 Yang et al. ................. 341/155
6,498,576 B1 * 12/2002 Tian et al. ................... 341/155

FOREIGN PATENT DOCUMENTS

| JP | 59-181638 | 10/1984 |
| JP | 64-73817 | 3/1989 |
| JP | 1-233750 | 9/1989 |

* cited by examiner

Primary Examiner—Bao Q. Vu
(74) Attorney, Agent, or Firm—Burns, Doane, Swecker & Mathis, LLP

(57) ABSTRACT

Analog input selection circuits comprising an input terminal, an output terminal, a transmission path extending between the input terminal and the output terminal, transmission switches that open or close the transmission path, an over-voltage protection switch which connects or does not connect the transmission path to the ground, a PMOS transistor provided between the input terminal and a power supply, and an NMOS transistor provided between the input terminal and the ground are formed on an identical semiconductor substrate. If the semiconductor substrate is P-type, then a region in which the NMOS transistor is formed is surrounded by an N-well region.

4 Claims, 3 Drawing Sheets

ANALOG INPUT SELECTION CIRCUIT PROTECTED FROM NEGATIVE OVER-VOLTAGE

FIELD OF THE INVENTION

The present invention relates to analog input selection circuits that are protected from a negative over-voltage and supply analog voltage signals to a common analog-digital converter ("A/D converter").

BACKGROUND OF THE INVENTION

An A/D converter formed on a semiconductor substrate typically has a plurality of analog input channels. Therefore, such A/D converters are provided with one analog input selection circuit for each analog input channel. The analog input selection circuits select one from among the plurality of analog input channels so that the selected analog input channel is connected to the A/D converter.

Assumed that there are two analog input selection circuits positioned adjacent to each other, the analog input channel corresponding to one of them has been connected to the A/D converter ("selected analog input selection circuit") and the analog input channel corresponding to the other of them has not been connected to the A/D converter ("non-selected analog input selection circuit"). In this case, an over-voltage applied to an input terminal of the non-selected analog input selection circuit degrades the conversion accuracy in the A/D converter. As a countermeasure against this, for example, an over-voltage protection circuit is provided in each analog input selection circuit as shown in FIG. 3. Over-voltage means both a positive over-voltage which exceeds a power supply voltage and a negative over-voltage which is lower than the ground voltage.

FIG. 3 is a circuit diagram which shows a configuration example of conventional analog input selection circuits. In FIG. 3, two analog input selection circuits 50 and 60 which are positioned adjacent to each other are commonly connected to an input terminal of an A/D converter 69. The analog input selection circuits 50 and 60 are connected in parallel. Both the analog input selection circuits 50 and 60 have the same configuration.

In the analog input selection circuit 50, serially connected transmission switches 52 and 53, which are to be operated to conduct selection/non-selection, are provided between an input terminal 51 supplied with an analog voltage signal and a common A/D converter 69. An over-voltage protection switch 54 is provided between a connection terminal of the switches 52 and 53 and the ground. A diode-connected PMOS transistor 56 is provided between the input terminal 51 and a power supply 55. A diode-connected NMOS transistor 57 is provided between the input terminal 51 and the ground. The PMOS transistor 56 is a protection transistor for positive over-voltage, and the NMOS transistor 57 is a protection transistor for negative over-voltage.

In the analog input selection circuit 60, serially connected transmission switches 62 and 63, which are to be operated to conduct selection/non-selection, are provided between an input terminal 61 supplied with an analog voltage signal and the common A/D converter 69. An over-voltage protection switch 64 is provided between a connection terminal of the switches 62 and 63 and the ground. A diode-connected PMOS transistor 66 is provided between the input terminal 61 and a power supply 65. A diode-connected NMOS transistor 67 is provided between the input terminal 61 and the ground. The PMOS transistor 66 is a protection transistor for positive over-voltage, and the NMOS transistor 67 is a protection transistor for negative over-voltage.

Operation of the circuit shown in FIG. 3 will now be explained. FIG. 3 shows a state in which the analog input selection circuit 50 has been selected and is being used for A/D conversion and the analog input selection circuit 60 has not been selected. That is, in the analog input selection circuit 50, the switch 54 is opened, and the switches 52 and 53 formed of transfer gates are closed. The input terminal 51 is thus connected to the A/D converter 69, and the analog voltage signal applied to the input terminal 51 is transferred to the A/D converter 69.

On the other hand, in the analog input selection circuit 60, the switches 62 and 63 formed of transfer gates are opened. The connection between the input terminal 61 and the A/D converter 69 is thus disconnected. As a result, the analog voltage signal applied to the input terminal 61 is prevented from being transferred to the A/D converter 69. The switch 64 is closed.

At this time, if a positive over-voltage which exceeds the power supply voltage is applied to the input terminal 51 of the analog input selection circuit 50, the PMOS transistor 56 turns on to prevent the positive over-voltage from being input to the A/D converter 69. If a negative over-voltage which is lower than the ground voltage is applied to the input terminal 51, the NMOS transistor 57 turns on to prevent the negative over-voltage from being input to the A/D converter 69.

On the other hand, if a positive over-voltage which exceeds the power supply voltage is applied to the input terminal 61 of the analog input selection circuit 60, the PMOS transistor 66 turns on to prevent an undesired current from flowing in the analog input selection circuit 60. If a negative over-voltage which is lower than the ground voltage is applied to the input terminal 61, the NMOS transistor 67 turns on to prevent an undesired current from flowing in the analog input selection circuit 60.

As a matter of fact, even if the switches 62 and 63 are open in the non-selected analog input selection circuit 60, however, an undesired current caused by an over-voltage is sometimes transferred to the A/D converter 69 through the switches 62 and 63, resulting in a lowered conversion accuracy of the A/D converter 69.

Therefore, the switches 54 and 64 for over-voltage protection are provided. In the non-selected analog input selection circuit 60, which is not being used for A/D conversion, the switch 64 is closed to draw the undesired current which flows through the switches 62 and 63 to the ground and thereby ensure the accuracy of the A/D converter 69. In the analog input selection circuit 50 as well, the switch 54 is closed when the analog input selection circuit 50 is not selected.

However, the conventional analog input selection circuit has a problem that the influence of over-voltage cannot be sufficiently excluded although the over-voltage protection circuit is provided. Hereafter, the problem will be explained by referring to FIGS. 4 and 5. FIG. 4 is a sectional view which shows an N-well CMOS process of PMOS transistors shown in FIG. 3. FIG. 5 is a sectional view which shows an N-well CMOS process of NMOS transistors shown in FIG. 3.

With reference to FIG. 4, in a main surface of a P-type substrate 70, two N-well regions 71 and 72 are formed on both sides of a formation region of an oxide film 73. A PMOS transistor is formed in each of the two N-well regions 71 and 72.

A P+ channel 74 and a P+ channel 75 are formed in a first N-well region 71. A source electrode, which is not shown, is formed in the P+ channel 74. A drain electrode, which is not shown, is provided in the P+ channel 75. A gate electrode 76 is provided on the surface between the P+ channel 74 and the P+ channel 75. A first one of the PMOS transistors shown in FIG. 3 is formed of them. The source electrode, which is provided in the P+ channel 74 and which is not shown, is connected to a power supply 77. The drain electrode, which is provided in the P+ channel 75 and which is not shown, is connected to an input terminal 78 supplied with an analog voltage signal.

A P+ channel 79 and a P+ channel 80 are formed in a second N-well region 72. A source electrode, which is not shown, is provided in the P+ channel 79. A drain electrode, which is not shown, is provided in the P+ channel 80. A gate electrode 81 is provided on the surface between the P+ channel 79 and the P+ channel 80. A second one of the PMOS transistors shown in FIG. 3 is formed of them. The source electrode, which is provided in the P+ channel 79 and which is not shown, is connected to a power supply 82. The drain electrode, which is provided in the P+ channel 80 and which is not shown, is connected to an input terminal 83 supplied with an analog voltage signal.

With reference to FIG. 5, a region of an oxide film 91 is formed on a main surface of a P-type substrate 90. NMOS transistors are formed on both sides of the formation region of the oxide film 91. As for the first one of the NMOS transistors shown in FIG. 3, an N+ channel 92 and an N+ channel 93 are formed. A source electrode, which is not shown, is provided in the N+ channel 92. A drain electrode, which is not shown, is provided in the N+ channel 93. A gate electrode 94 is provided on the surface between the N+ channel 92 and N+ channel 93. The first one of the NMOS transistors shown in FIG. 3 is formed of them. The source electrode, which is provided in the N+ channel 92 and which is not shown, is connected to the ground. The drain electrode, which is provided in the N+ channel 93 and which is not shown, is connected to an input terminal 95 supplied with an analog voltage signal.

As for a second one of the NMOS transistors shown in FIG. 3, an N+ channel 96 and an N+ channel 97 are formed. A source electrode, which is not shown, is provided in the N+ channel 96. A drain electrode, which is not shown, is provided in the N+ channel 97. A gate electrode 98 is provided on the surface between the N+ channel 96 and N+ channel 97. The second one of the NMOS transistors shown in FIG. 3 is formed of them. The source electrode, which is provided in the N+ channel 96 and which is not shown, is connected to the ground. The drain electrode, which is provided in the N+ channel 97 and which is not shown, is connected to an input terminal 99 supplied with an analog voltage signal.

The two PMOS transistors are isolated by the N-well regions 71 and 72 as shown in FIG. 4. Even if a positive over-voltage is applied to an input terminal 78 of the first PMOS transistor, therefore, the P+ channel 80, which is an input port of the second PMOS transistor adjacent to the first PMOS transistor, is not affected. An undesired current flows from the P+ channel to the power supply 77. Even if a positive over-voltage is applied to an input terminal 83 of the second PMOS transistor, the same holds true.

However, the two NMOS transistors are not isolated, but coupled by the P-type substrate 90 as shown in FIG. 5. If a negative over-voltage is applied to an input terminal 95 of the first NMOS transistor (the non-selected input terminal 61 in the example shown in FIG. 3), therefore, an undesired current propagates through the P-type substrate 90, arrives at the N+ channel 97, which is an input port of a second NMOS transistor adjacent to the first NMOS transistor, and affects an input terminal 99 of the second NMOS transistor (the input terminal 51 which is being used for A/D conversion in the example shown in FIG. 3). Even if a negative over-voltage is applied to the input terminal 99 of the second NMOS transistor, the same holds true.

In other words, in the protection transistors of the conventional analog input selection circuit, a protection effect for a positive over-voltage can be anticipated because adjacent PMOS transistors are isolated from each other by the N-well regions. When a negative over-voltage is applied, however, the A/D conversion accuracy is degraded sometimes because the adjacent NMOS transistors affect each other.

In the foregoing explanation, the semiconductor substrate is P-type. If the semiconductor substrate is N-type, respective transistors are formed in a way opposite to that of the foregoing explanation. When a positive over-voltage is applied, therefore, adjacent PMOS transistors affect each other, resulting in degradation of the A/D conversion accuracy in the same way.

SUMMARY OF THE INVENTION

It is an object of this invention to provide an analog input selection circuit having a configuration in which transistors for protection do not affect each other in response to a positive or negative over-voltage.

The analog input selection circuit according to one aspect of the present invention comprises a plurality of analog input selection units formed on an identical P-type semiconductor substrate. Each of the analog input selection units including an input terminal, an output terminal, a transmission path extending between the input terminal and the output terminal, wherein an analog voltage signal is input into the input terminal, transmission switches which allow the analog voltage signal to pass through the transmission path when that particular analog input selection unit is selected, and which does not allow the analog voltage signal to pass through the transmission path when that particular analog input selection unit is not selected, an over-voltage protection switch which allows the analog voltage signal to pass to the ground when that particular analog input selection unit is selected, and which does not allow the analog voltage signal to pass to the ground when that particular analog input selection unit is not selected, a PMOS transistor provided between the input terminal and a power supply, and which flows an undesired current generated by a positive over-voltage applied to the input terminal, to the power supply, and an NMOS transistor provided between the input terminal and the ground, and which flows an undesired current generated by a negative over-voltage applied to the input terminal, to the ground. A region in which the NMOS transistor is formed in each of the analog input selection units is surrounded by an N-well region.

The analog input selection circuit according to another aspect of the present invention comprises a plurality of analog input selection units formed on an identical N-type semiconductor substrate. Each of the analog input selection units including an input terminal, an output terminal, a transmission path extending between the input terminal and the output terminal, wherein an analog voltage signal is input into the input terminal, transmission switches which allow the analog voltage signal to pass through the transmission path when that particular analog input selection unit is selected, and which does not allow the analog voltage signal to pass through the transmission path when that particular analog input selection unit is not selected, an over-voltage protection switch which allows the analog voltage signal to pass to the ground when that particular analog input selection unit is selected, and which does not allow the analog voltage signal to pass to the ground when that particular analog input selection unit is not selected, a PMOS transistor provided between the input terminal and a power supply, and which flows an undesired current generated by a positive over-voltage applied to the input terminal, to the power supply, and an NMOS transistor provided between the input terminal and the ground, and which flows an undesired current generated by a negative over-voltage applied to the input terminal, to the ground. A region in which the NMOS transistor is formed in each of the analog input selection circuits is surrounded by a P-well region.

Other objects and features of this invention will become apparent from the following description with reference to the accompanying drawings.

DETAILED DESCRIPTIONS

An embodiment of the analog input selection circuit according to the present invention will be explained while referring to the accompanying drawings.

Figure 1:
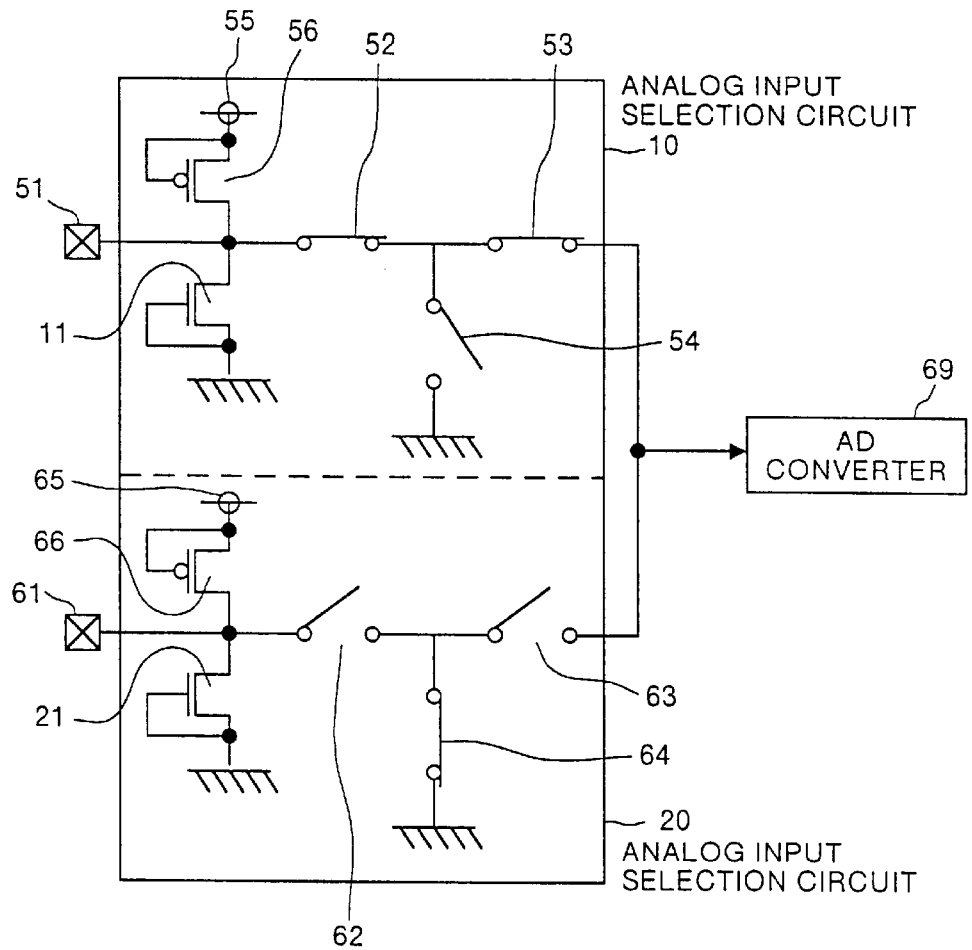
FIG. 1 is a circuit diagram which shows a configuration of analog input selection circuits which is an embodiment of the present invention.

FIG. 1 is a circuit diagram which shows a configuration of the analog input selection circuits according to an embodiment of the present invention. In FIG. 1, components which are the same as or similar to components shown in the conventional art (FIG. 3) are denoted by like reference numerals. The portion that relates to the present embodiment will now be explained mainly.

Figure 3:
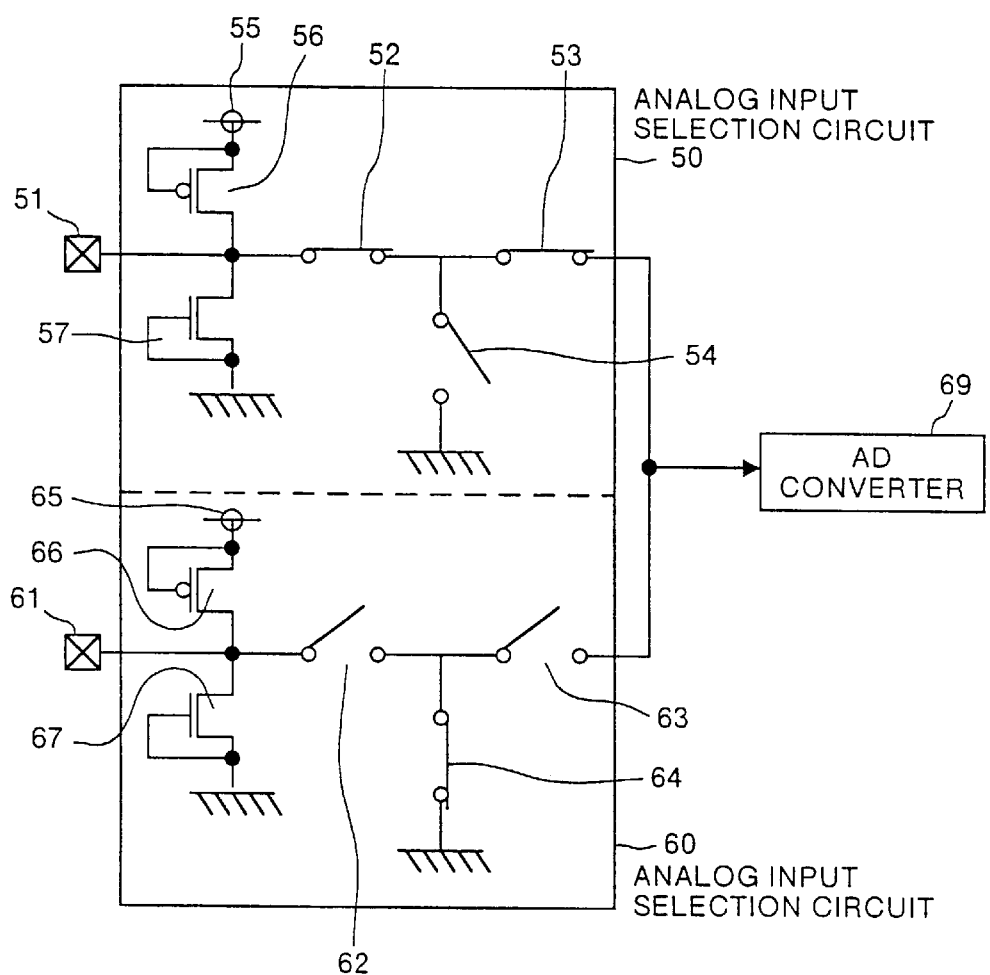
FIG. 3 is a circuit diagram which shows a configuration example of conventional analog input selection circuits.

Analog input selection circuits 10 and 20 are provided in FIG. 1, instead of the analog input selection circuits 50 and 60 in the configuration shown in FIG. 3. An NMOS transistor 11 is provided in the analog input selection circuit 10, instead of the NMOS transistor 57 shown in FIG. 3. An NMOS transistor 21 is provided in the analog input selection circuit 20, instead of the NMOS transistor 67 shown in FIG. 3. Other components are the same as those in the configuration shown in FIG. 3.

Figure 2:
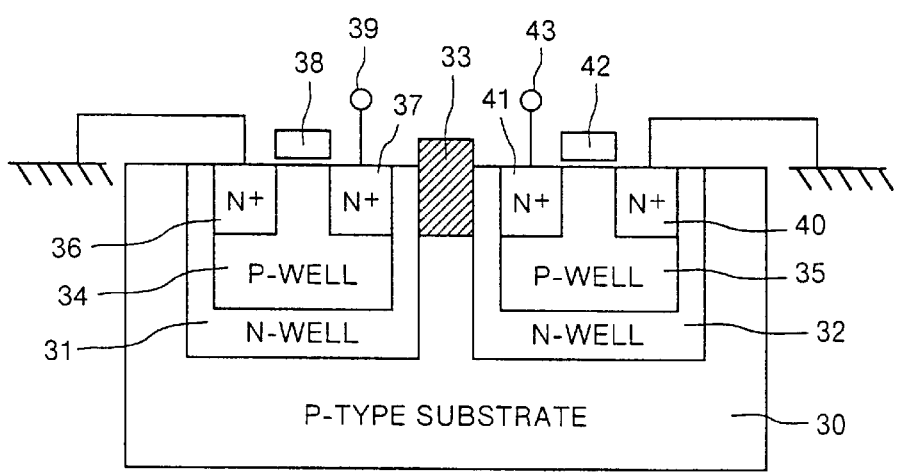
FIG. 2 is a sectional view which shows an N-well CMOS process of NMOS transistors shown in FIG. 1.
Figure 4:
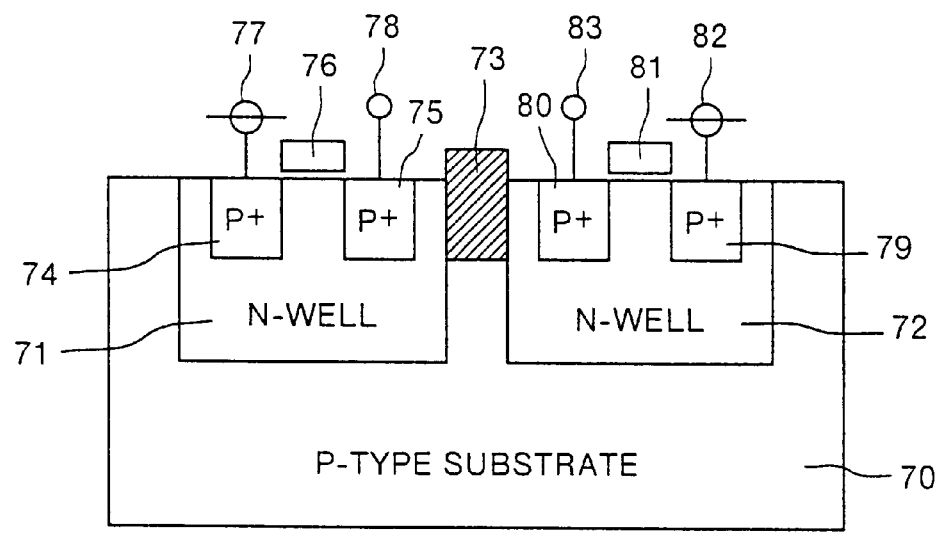
FIG. 4 is a sectional view which shows an N-well CMOS process of PMOS transistors shown in FIG. 3.
Figure 5:
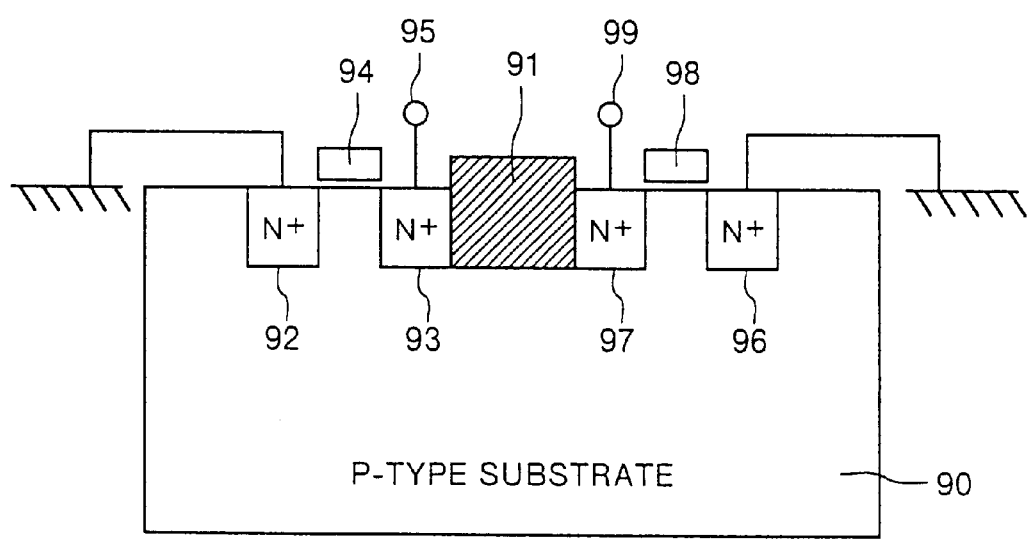
FIG. 5 is a sectional view which shows an N-well CMOS process of NMOS transistors shown in FIG. 3.

In the present embodiment as well, the PMOS transistors 56 and 66 are formed as shown in FIG. 4. On the other hand, the NMOS transistors 11 and 21 in the present embodiment are formed, for example, as shown in FIG. 2. FIG. 2 is a sectional view which shows an N-well CMOS process of NMOS transistors shown in FIG. 1.

With reference to FIG. 2, in a main surface of a P-type substrate 30, two N-well regions (hereafter referred to as "bottom N-well regions") 31 and 32, each of which takes the shape of Greek letter π, are formed on both sides of a region in which an oxide film 33 is formed ("formation region of oxide film 33"). P-well regions 34 and 35 are formed in regions respectively surrounded by the bottom N-well regions 31 and 32. NMOS transistors are formed respectively in the P-well regions 34 and 35.

As for the NMOS transistor formed in a first P-well region 34, an N+ channel 36 and an N+ channel 37 are formed. A source electrode, which is not shown, is provided in the N+ channel 36. A drain electrode, which is not shown, is provided in the N+ channel 37. A gate electrode 38 is provided on the surface between the N+ channel 36 and N+ channel 37. The NMOS transistor formed in the first P-well region 34 is formed of them. The source electrode, which is provided in the N+ channel 36 and which is not shown, is connected to the ground. The drain electrode, which is provided in the N+ channel 37 and which is not shown, is connected to an input terminal 39 supplied with an analog voltage signal.

As for the NMOS transistor formed in a second P-well region 35, an N+ channel 40 and an N+ channel 41 are formed. A source electrode, which is not shown, is provided in the N+ channel 40. A drain electrode, which is not shown, is provided in the N+ channel 41. A gate electrode 42 is provided on the surface between the N+ channel 40 and N+ channel 41. The NMOS transistor formed in the second P-well region 35 is formed of them. The source electrode, which is provided in the N+ channel 40 and which is not shown, is connected to the ground. The drain electrode, which is provided in the N+ channel 41 and which is not shown, is connected to an input terminal 43 supplied with an analog voltage signal.

Operation of a portion which concerns the present embodiment will now be explained by referring to FIGS. 1 and 2. If a negative over-voltage is applied to a first input terminal 39 shown in FIG. 2, an undesired current flows from the N+ channel 37 to the P-well region 34, and flows from the N+ channel 36 to the ground. The adjacent NMOS transistors are isolated from each other by the bottom N-well regions 31 and 32. At this time, therefore, an undesired current caused by the over-voltage which is applied to the first input terminal 39 is prevented from being transferred to the N+ channel 41, which is an input port of a second NMOS transistor. Therefore, an influence exerted on the adjacent input terminal 43 can be reduced.

With reference to the example shown in FIG. 1, if a negative over-voltage is applied to the input terminal 61 of the non-selected analog input selection circuit 20, an undesired current flows to the ground through the NMOS transistor 21 and its propagation to the NMOS transistor 11 in the analog input selection circuit 10 which is being used for A/D conversion is prevented. Accordingly, its influence on the input terminal 51 is remarkably reduced. As a result, the conversion accuracy of the A/D converter 69 can be improved.

In the foregoing explanation of the present embodiment, the semiconductor substrate is a P-type substrate in the same way as the example of the conventional art. However, analog input selection circuits are mounted on an N-type substrate sometimes. In this instance, PMOS transistor formation regions should be surrounded by P-well regions so as to isolate the PMOS transistor formation regions from each other. By doing so, an influence of a positive over-voltage applied to an adjacent non-selected input terminal can be reduced. In the same way, therefore, the A/D conversion accuracy can be improved.

As heretofore explained, according to the analog input selection circuit this invention, even if a negative over-voltage is applied to an input terminal of the non-selected analog input selection circuit and an undesired current flows through an NMOS transistor which has turned on, an input port of the adjacent NMOS transistor is not affected because the adjacent NMOS transistors are isolated by the N-well regions. Accordingly, an influence of the negative over-voltage applied to the input terminal of the non-selected analog input selection circuit exerted on the input terminal of the adjacent analog input selection circuit under A/D conversion can be reduced. As a result, the conversion accuracy can be prevented from being degraded by the negative over-voltage.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. Analog input selection circuit comprising:
   a plurality of analog input selection units formed on an identical P-type semiconductor substrate, each of the analog input selection units including
   an input terminal, an output terminal, a transmission path extending between the input terminal and the output terminal, wherein an analog voltage signal is input into the input terminal;
   transmission switches which allow the analog voltage signal to pass through the transmission path when that particular analog input selection unit is selected, and which does not allow the analog voltage signal to pass through the transmission path when that particular analog input selection unit is not selected;
   an over-voltage protection switch which allows the analog voltage signal to pass to the ground when that particular analog input selection unit is selected, and which does not allow the analog voltage signal to pass to the ground when that particular analog input selection unit is not selected;
   a PMOS transistor provided between the input terminal and a power supply, and which flows an undesired current generated by a positive over-voltage applied to the input terminal, to the power supply; and
   an NMOS transistor provided between the input terminal and the ground, and which flows an undesired current generated by a negative over-voltage applied to the input terminal, to the ground,
   wherein a region in which the NMOS transistor is formed in each of the analog input selection units is surrounded by an N-well region.

2. The analog input selection circuit according to claim 1, wherein an analog-to-digital converter is commonly connected to the output terminals of the analog input selection units and the analog-to-digital converter converts the analog voltage signal of the selected analog input selection unit to digital voltage signal.

3. Analog input selection circuit comprising:
   a plurality of analog input selection units formed on an identical N-type semiconductor substrate, each of the analog input selection units including
   an input terminal, an output terminal, a transmission path extending between the input terminal and the output terminal, wherein an analog voltage signal is input into the input terminal;
   transmission switches which allow the analog voltage signal to pass through the transmission path when that particular analog input selection unit is selected, and which does not allow the analog voltage signal to pass through the transmission path when that particular analog input selection unit is not selected;
   an over-voltage protection switch which allows the analog voltage signal to pass to the ground when that particular analog input selection unit is selected, and which does not allow the analog voltage signal to pass to the ground when that particular analog input selection unit is not selected;
   a PMOS transistor provided between the input terminal and a power supply, and which flows an undesired current generated by a positive over-voltage applied to the input terminal, to the power supply; and
   an NMOS transistor provided between the input terminal and the ground, and which flows an undesired current generated by a negative over-voltage applied to the input terminal, to the ground,
   wherein a region in which the NMOS transistor is formed in each of the analog input selection units is surrounded by a P-well region.

4. The analog input selection circuit according to claim 3, wherein an analog-to-digital converter is commonly connected to the output terminals of the analog input selection units and the analog-to-digital converter converts the analog voltage signal of the selected analog input selection unit to digital voltage signal.

* * * * *